US009635722B1

(12) United States Patent
Cao

(10) Patent No.: US 9,635,722 B1
(45) Date of Patent: Apr. 25, 2017

(54) LED STRING LIGHT

(71) Applicant: Lin-Yu Cao, Guangdong (CN)

(72) Inventor: Lin-Yu Cao, Guangdong (CN)

( * ) Notice: Subject to any disclaimer, the term of this patent is extended or adjusted under 35 U.S.C. 154(b) by 0 days.

(21) Appl. No.: 14/961,893

(22) Filed: Dec. 8, 2015

(51) Int. Cl.
*H05B 37/02* (2006.01)
*F21S 4/00* (2016.01)
*H05B 33/08* (2006.01)
*H01L 33/48* (2010.01)
*F21V 23/00* (2015.01)
*F21Y 101/00* (2016.01)

(52) U.S. Cl.
CPC ............ *H05B 33/0821* (2013.01); *F21S 4/00* (2013.01); *F21V 23/001* (2013.01); *H01L 33/486* (2013.01); *F21Y 2101/00* (2013.01)

(58) Field of Classification Search
CPC H05B 33/08; H05B 33/0803; H05B 33/0806; H05B 37/02; F21Y 2101/02; F21Y 2105/001; F21S 4/001; F21V 19/001
USPC ............ 315/185 R, 192, 291, 307, 308, 312; 362/226, 249, 252, 391, 396, 249.06, 800
See application file for complete search history.

(56) References Cited

U.S. PATENT DOCUMENTS

2010/0289415 A1* 11/2010 Chen .................. H05B 33/0803 315/185 R
2014/0254146 A1* 9/2014 Rapisarda .......... H05B 33/0803 362/227

* cited by examiner

*Primary Examiner* — Jimmy Vu
(74) *Attorney, Agent, or Firm* — Leong C. Lei

(57) ABSTRACT

The string light contains three copper wires and a number of lighting units and each lighting unit contains at least two surface-mount-device (SMD) light emitting diodes (LEDs). A first wire and a second wire are connected to a positive terminal and a negative terminal of a power source, respectively. Within each lighting unit, a first SMD LED has its anode connected to the first wire, a second SMD LED has its cathode connected to the second wire, and the first and second SMD LEDs have their cathode and anode connected to a third wire, respectively. The string light is capable of withstanding stronger pull by employing three wires. The parallel-connected lighting units and the series-connected SMD LEDs within each lighting unit significantly reduce the effect of voltage drop.

5 Claims, 3 Drawing Sheets

LED STRING LIGHT

BACKGROUND OF THE INVENTION (a) Technical Field of the Invention

The present invention is generally related to string lights, and more particular to a string light using surface-mount-device (SMD) light emitting diodes (LEDs).

(b) Description of the Prior Art

FIG. 1 depicts a conventional way of connecting light emitting diodes (LEDs) in a string light. As illustrated, the LEDs 41 are parallel-connected between a positive copper wire 10 and a negative copper wire 20. A string light having this kind of wiring connection can only withstand weaker pull and broken wire is not uncommon. In addition, the gauge of copper wires 10 and 20 is usually less than 0.4 mm and, if surface-mount-device (SMD) light emitting diodes (LEDs) 41 are used, their rated voltage is 2 to 3V. The copper wires 10 and 20 themselves would introduce a significant voltage drop when a large number of LEDs 41 are deployed, and therefore it is often found that the LEDs 41 at the two ends of the string light are of different brightness. Furthermore, this kind of string light of a single parallel connection is not flexible enough for different applications.

SUMMARY OF THE INVENTION

A novel string light is provided here which contains three copper wires and a number of lighting units, and each lighting unit contains at least two surface-mount-device (SMD) light emitting diodes (LEDs). A first wire and a second wire are connected to a positive terminal and a negative terminal of a power source, respectively. Within each lighting unit, a first SMD LED has its anode connected to the first wire, a second SMD LED has its cathode connected to the second wire, and the first and second SMD LEDs have their cathode and anode connected to a third wire, respectively. The string light is capable of withstanding stronger pull by employing three wires. The parallel-connected lighting units and the series-connected SMD LEDs within each lighting unit so that each lighting unit has its operational current maintained at a certain magnitude, significantly reducing the effect of voltage drop.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
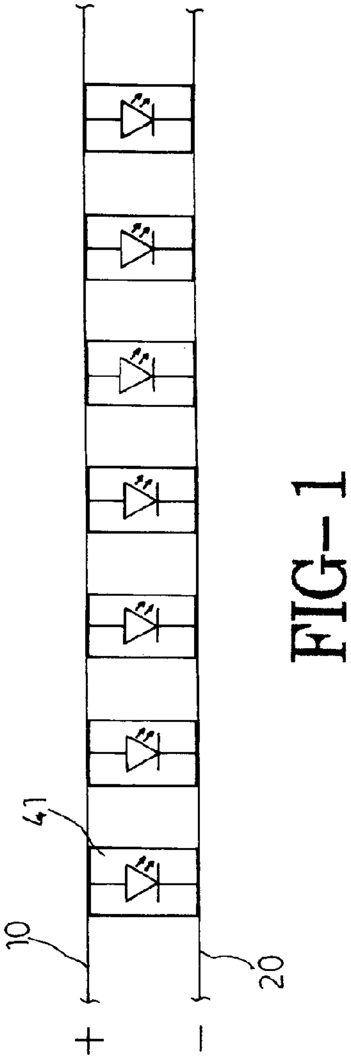
FIG–1 PRIOR ART
FIG. 1 is a schematic diagram showing a conventional string light.
Figure 2:
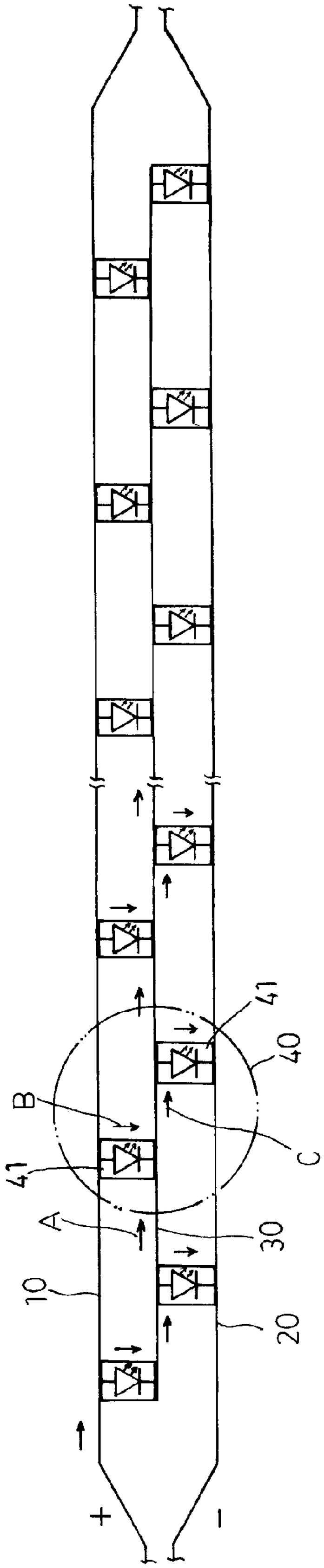
FIG. 2 is a schematic diagram showing a string light using light emitting diodes (LEDs) according to a first embodiment of the present invention.

FIG. 2 is a schematic diagram showing a string light according to a first embodiment of the present invention. The string ling mainly contains three copper wires 10, 20, 30, and a number of lighting units 40. Each lighting unit 40 contains at least two surface-mount-device (SMD) light emitting diodes (LEDs) 41. In the present embodiment, two SMD LEDs 41 are used as example. The copper wires 10 and 20 are connected to a positive terminal and a negative terminal of a power source, respectively. For each lighting unit 40, a first SMD LED 41 has its anode connected to the copper wire 10, a second SMD LED 41 has its cathode connected to the copper wire 20, and the first and second SMD LEDs 41 have their cathode and anode connected to the other copper wire 30, respectively.

According to the present invention, a string light configured as described above is capable of withstanding a stronger pull. In addition, for each lighting unit 40, it receives not only current B from the copper wire 10, but also a residual current A from a previous lighting unit 40. As such, each lighting unit 40 has its operational current C maintained at a certain magnitude, thereby significantly reducing the effect of voltage drop. In other words, each SMD LED 41 within each lighting unit 40 should have a uniform brightness, even between the first SMD LED 41 of a first lighting unit 40 and the second SMD LED 41 of a last lighting unit 40 of the string light.

Figure 3:
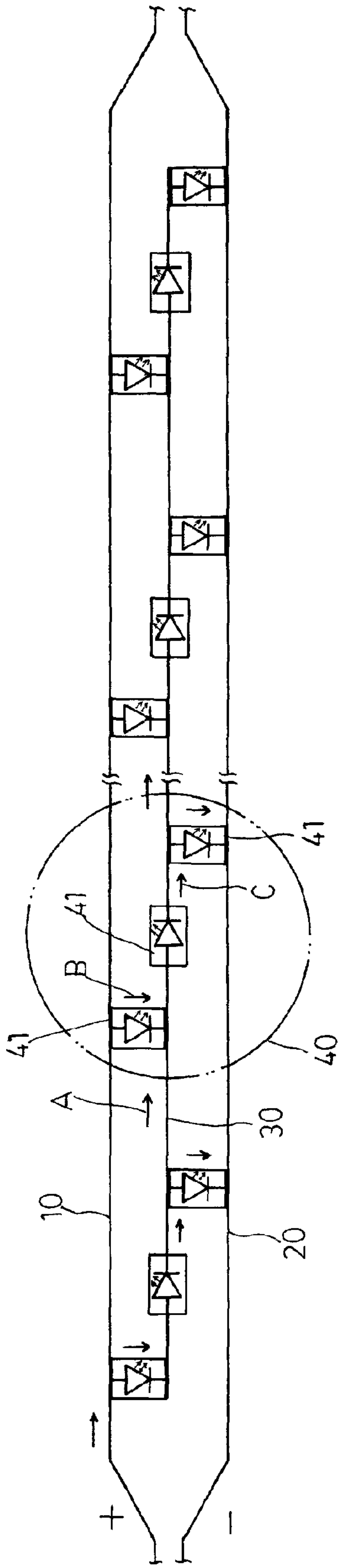
FIG. 3 is a schematic diagram showing a string light using LEDs according to a second embodiment of the present invention.
Figure 4:
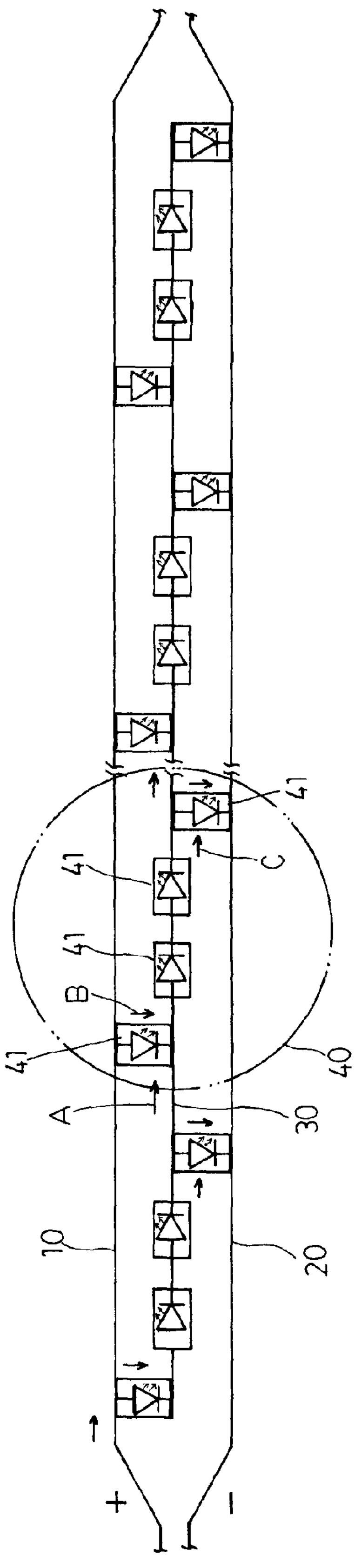
FIG. 4 is a schematic diagram showing a string light using LEDs according to a third embodiment of the present invention.

FIGS. 3 and 4 depict a second embodiment and a third embodiment of the present invention. As illustrated, the second embodiment has three SMD LEDs 41 whereas the third embodiment has four SMD LEDs 41 within each lighting unit 40. For the second embodiment, a third SMD LED 41 is series-connected between the first and second SMD LEDs 41 along the copper wire 30. Similarly, for the third embodiment, a third SMD LED 41 and a fourth SMD LED 41 are series-connected between the first and second SMD LEDs 41 along the copper wire 30.

Figure 5:
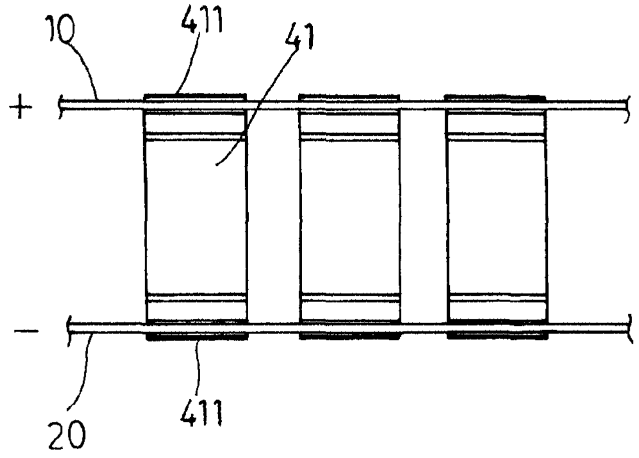
FIG. 5 is a schematic diagram showing an embodiment of a SMD LED of the string light of the present invention.
Figure 6:
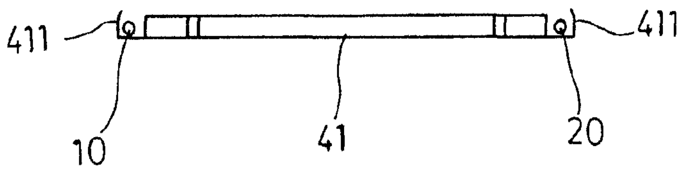
FIG. 6 is a schematic cross-sectional diagram showing the SMD LED of FIG. 5.

As shown in FIGS. 5 and 6, a SMD LED 41 within each lighting unit 40 is configured with copper buckles 411 at its two ends. To install a SMD LED 40, a specific apparatus is applied to press and lock the copper buckles 411 onto the copper wires 10 and 30, or onto the copper wires 30 and 20. Alternatively, the SMD LEDs 41 can have their both ends directly welded to the copper wires.

By employing three copper wires, the present invention is capable of withstanding stronger pull. The lighting units are parallel connected whereas the SMD LEDs within each lighting unit is series-connected, allowing for more flexible applications.

The string light of the present invention can be provisioned by 4-48V low voltage and therefore the copper wires 10 and 20 can have their ends configured with USB connectors, or can have their ends directly connected to the positive and negative terminals of a low voltage power source such as a battery pack, a solar panel, or a rectifying transformer. The string light of the present invention can be provisioned by 48-120V high voltage While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A string light, comprising:

a first copper wire, a second copper wire, and a third copper wire; and a plurality of lighting units, each comprising a first surface-mount-device (SMD) light emitting diode (LED) and a second SMD LED;

wherein the first and second copper wires are connected to a positive terminal and a negative terminal of a power source, respectively; the first SMD LED of each lighting unit has an anode connected to the first copper wire; the second SMD LED of each lighting unit has a cathode connected to the second copper wire; cathodes of the first SMD LEDs are connected to the third copper wire, and anodes of the second SMD LEDs are connected to the third copper wire.

2. The string light according to claim 1, wherein each SMD LED is configured with copper buckles at two ends; the first SMD LEDs have copper buckles pressed and locked to the first and third copper wires, respectively; and the second SMD LEDs have copper buckles pressed and locked to the third and second copper wires, respectively.

3. The string light according to claim 1, wherein the first SMD LEDs have both ends welded to the first and third copper wires, respectively; and the second SMD LEDs have both ends welded to the third and second copper wires, respectively.

4. The string light according to claim 1, wherein each lighting unit further comprises at least a third SMD LED series-connected between the first and second SMD LEDs along the third copper wire.

5. The string light according to claim 1, wherein the power source is a rectifying transformer.

* * * * *